United States Patent [19]

Lescourret

[11] Patent Number: 4,920,317
[45] Date of Patent: Apr. 24, 1990

[54] OSCILLATOR FOR MEASURING THE AMBIENT MAGNETIC FIELD

[75] Inventor: Jean-Louis Lescourret, Bourg Les Valence, France

[73] Assignee: Crouzet (Sociéé Anonyme francaise), Montrouge, France

[21] Appl. No.: 301,523

[22] Filed: Jan. 23, 1989

[30] Foreign Application Priority Data

Jan. 26, 1988 [FR] France ................. 88 00960

[51] Int. Cl.$^5$ .............................................. G01R 33/20
[52] U.S. Cl. ................................ 324/318; 324/322
[58] Field of Search ............ 324/300, 307, 318, 319, 324/320, 322, 301, 302, 304, 315

[56] References Cited

U.S. PATENT DOCUMENTS

| | | | |
|---|---|---|---|
| 3,376,500 | 4/1966 | Scaggs | 324/322 |
| 4,110,681 | 8/1978 | Hofer | 324/313 |
| 4,128,814 | 12/1978 | Reinhardt | 324/307 |
| 4,193,024 | 3/1980 | Hoult | 324/313 |
| 4,284,949 | 8/1981 | Vidrine | 324/315 |
| 4,329,646 | 5/1982 | Tsuda | 324/307 |
| 4,414,535 | 11/1983 | Ferriss | 324/304 |
| 4,780,672 | 10/1988 | McGregor | 324/304 |

OTHER PUBLICATIONS

C. Blanc et al., "Frequency-to-Magnetic-Field Converter for Nuclear Magnetic Resonance Magnetometer", Journal of Physics E: Scientific Instruments, vol. 12, No. 8 (1979), pp. 731-733.
J. K. Hulbert "A Field Tracking Digital NMR Magnetometer for in Situ Use for Superconducting Solenoids", Journal of Physics E: Scientific Instruments, vol. 9, No. 4 (Apr. 1976), pp. 283-286.
J. Tzeng Lue "An Automatic Tracking Nuclear Magnetic Resonance Gaussmeter", Nuclear Instruments and Methods, vol. 147, No. 3 (Dec. 1977), pp. 595-598.
K. H. Carpenter and M. K. daSilva "Phase-Locked Yttrium Iron Garnet Magnetometer for Remote Measurement of Small Field Changes in a Fluctuating Background", Rev of Sci Instru (No. 9 (9/82), pp. 1414-1417.

Primary Examiner—Michael J. Tokar
Attorney, Agent, or Firm—Lowe, Price, LeBlanc, Becker & Shur

[57] ABSTRACT

An oscillator is provided whose oscillation frequency is substantially proportional to the intensity of the ambient magnetic field, and which is used for measuring said magnetic field, and comprising a magnetic resonance magnetometric probe for detecting a signal at the frequency of said magnetic resonance in response more particularly to a low frequency excitation signal and means for generating said low frequency excitation signal in response to the detected signal, said generation means comprising a loop for locking the phase of said low frequency excitation signal to the phase of said detected signal, and initialization means so that said low frequency excitation signal sweeps a range of frequencies when said loop is not locked.

6 Claims, 3 Drawing Sheets

OSCILLATOR FOR MEASURING THE AMBIENT MAGNETIC FIELD

BACKGROUND OF THE INVENTION

1. Field of the Invention

The present invention relates to an oscillator whose oscillation frequency is proportional to the intensity of the ambient magnetic field, used for measuring said magnetic field and comprising a magnetic resonance magnetometric probe for detecting a signal at the frequency of said magnetic resonance, in response to a low frequency excitation signal, and means for generating said low frequency excitation signal in response to the detected signal.

The present invention relates then more particularly to nuclear magnetic resonance magnetometer (NMR) probes.

2. Description of the Prior Art

Such probes are known in the technique and different types of NMR magnetometers are described for example in the French patent applications 1 447 226, 2 098 624 and 2 583 487. It will be recalled that this apparatus comprises at least two liquid samples contained in flasks, these flasks being disposed in a resonating cavity excited at very high frequency. A detector comprises windings about said flasks for picking up and re-injecting a frequency at the Larmor frequency depending, on the one hand on the magnetic field in which the probe bathes and, on the other hand, on the natural gyromagnetic ratio of the liquid samples contained in the flasks.

FIG. 1 shows one example of a NMR probe mounted in a nuclear oscillator in accordance with the prior art. In this figure, block 1 designates a NMR probe comprising two flasks 2 and 3, a detector and low frequency excitation winding 4, the whole being disposed in a cavity excited by a very high frequency signal, designated VHF. The middle point of the winding 4 is here connected to ground and the two ends of winding 4 form two accesses to the probe. A double filter 5, for eliminating the VHF frequency, is provided with two inputs connected to these two accesses and two outputs. Between these two outputs are disposed a succession of parallel capacitors 6, only two of which have been shown and which may be brought into service or not by switches 7 for filtering out the noise around the Larmor frequency, in relation with the shelf inductances of winding 4 and resistors 8, resistors 8 being also connected in parallel across the capacitors 6. The outputs of the double low frequency filter 6, 7, 8 thus formed are connected to the inputs of a wide band amplifier circuit 9 comprising a pre-amplifier and amplifier stages. The output of the amplifier circuit 9 is fed, on the one hand, to the middle point of resistors 8, possibly through a phase shift circuit 10 introducing a 90° phase shift and, on the other hand, to a frequency measuring assembly comprising a digital filtering and digitization system 11 and a frequency meter 12 which is generally connected to a high precision clock 13. The output of the frequency meter 12 is for example applied to a microprocessor for controlling the information received which represents the measured values of the magnetic field and possibly coding them and re-emitting them to a user circuit.

Thus, the assembly of elements 1 to 10 forms what is usually called a nuclear oscillator which oscillates normally at the precision frequency of the nuclear spins (or Larmor frequency $f_0$) if suitable gain and phase conditions are respected. Now, because of geometric and electronic dissymetries or parasite effects on the windings and coils (capacitive effects, coupling between coils), such as circuit risks forming an oscillator at the natural frequency of the coils, generally between 10 and 25 kHz depending on the parasite capacity in parallel with the coils, particularly that due to the cables connecting the coils to the amplifier. It is then necessary to inject an excitation signal free of any energy outside a band of a few hundred Herz about the Larmor frequency, which is generally between 1000 and 3000 Hz depending on the conditions in which the probe is placed. In the conventional circuit shown in FIG. 1, this problem is solved by he above-mentioned filtering assembly formed of resistors 8 and one or more capacitors 6 which are selectively connected in parallel with the coils, depending on the state of switches 7 (in practice, these switches 7 will be semi-conductor switches, e.g. MOS transistors).

This solution has several drawbacks related both to the considerable and variable phase shift caused by this filtration mode and to the temperature sensitivity which results therefrom, without counting the problem raised by the initial choice of the capacitor to be connected in the filter. Such filtering cannot have a very narrow passband. It will at best give passbands of the order of a few hundred Hz.

Furthermore, even if the assembly of elements 1 to 10 of FIG. 1 made it possible to construct a satisfactory nuclear oscillator, there remains the operating frequency of the oscillator to be measured. For that, in the prior art, the clumsy solution shown is generally used which consists in using digitization and digital filtering by filter 11 before making a measurement with a frequency meter. In fact, measurement of the frequency of a signal is conventionally obtained from measurement of the period $T_s$ of this signal by means of a precision clock of frequency $F_H$ whose number $N_p$ of periods is counted during a time corresponding to a multiple of the periods of the signal, $nT_s$, the measured frequency is then equal to:

$$f = nF_H/N_p.$$

This procedure can only be used if the signal whose frequency it is desired to measure has a low noise corresponding to an instantaneous relatively low random phase, i.e. less than $2\pi$ by at least one order of size. In addition, in order to obtain high accuracy, the signal must be filtered so as to eliminate the noise energy outside the band $\pm \frac{1}{2}T_c$ about the resonance spectral line. Tc being the counting time ($T_c = nT_s$). Thus, the well known phenomenon of frequency folding in the presence of sampling is minimized and the frequency measurement is thus obtained with the required accuracy. But this results in the need, in prior art techniques, to use a digital filter before the frequemcy meter. It will be noted that such a digital filter forms a clumsy apparatus itself comprising microprocessors.

Furthermore, even with those precautions, the measured frequency will not be in the Larmor frequency $f_0$ but a frequency $f_m = f_0 + \tan \phi/T$, where T is the relaxation time of the probe which varies with the temperature and o a phase shift related more particularly to the presence of the switchable capacity filter and to the different amplifier stages. This phase shift cannot be predetermined and corresponds then to an error. In fact, the error factor tan $\phi/T$ is of the order of $10^{-3} f_0$. This does not a priori form a limitation for the conventional measurements. In fact, it is not generally $f_0$ that it is desired to measure but the variations of $f_0$ and if the error term were constant that would not raise any problem. But in fact, it is apparent that the values T and $\phi$ vary with time and the temperature and that thus, basically, this system cannot provide an accuracy greater than $10^{-6}$ over periods longer than a minute.

Consequently, an aim of the present invention is to provide a new nuclear oscillator circuit minimizing the drawbacks of the above mentioned prior art devices.

A more particular aim of the present invention is to filter simply the oscillation signal of a nuclear oscillator with a small-sized circuit, of low consumption and low cost.

Another aim of the invention is to filter the nuclear signal re-injected into the nuclear oscillator so as to avoid any parasite oscillation at the natural frequency of the coils.

Another aim of the present invention is to provide such a system which makes possible a frequency measurement with an accuracy of the order of $10^{-8}$.

Another aim of the present invention is to combine the function of filtering the signal preceding the frequency meter with the function of filtering the reinjected nuclear signal, in a single device placed inside the nuclear oscillator.

In other words, a problem which the invention aims at solving is the correct operation of a nuclear oscillator throughout the whole range of possible operating frequencies (currently from 1000 to 3000 Hz) and in a vast range of temperatures.

Another problem which the present invention aims at solving concerns the measurement of the frequency with an accuracy of some $10^{-8}$ for frequencies going from 1000 to 3000 Hz.

SUMMARY OF THE INVENTION

The object of the present invention is then to provide an oscillator whose oscillation substantially is proportional to the intensity of the ambient magnetic field, used for measuring said magnetic field, and comprising a magnetic resonance magnetometric probe for detecting a signal at the frequency of said magnetic resonance in response more particularly to a low frequency excitation signal and means for generating said low frequency excitation signal in response to the detected signal, characterized by the fact that said generation means comprise a loop for locking the phase of said low frequency excitation signal to the phase of said detected signal, and initialization means so that said low frequency excitation signal sweeps a range of frequencies when said loop is not locked.

Advantageously, said generation means delivers said low frequency excitation signal in digitial form and said loop uses, as phase comparator, a first D-A converter whose digital input receives said low frequency excitation signal in digital form and whose bias input receives said signal detected by said probe.

Again advantageously, said generation means comprise:

an oscillator whose frequency is controlled by the output voltage of the phase comparator and delivers a square wave signal, of a frequency signal to N times the frequency of said low frequency excitation signal, N being a positive integer, a counter of capacity N receiving the output of said controlled frequency oscillator and thus outputting a digital signal whose value varies from 1 to N cyclically, and a first memory, addressed by said counter, containing values of a sinusoidal function of $2\pi i/N$, whose output is said low frequency excitation signal in digital form.

Again advantageously, N is between 32 and 4096 ($2^5$ and $2^{12}$).

Again advantageously, said low frequency excitation signal applied to said probe is obtained from a second memory containing values of a sinusoidal function of $2\pi i/N$, shifted by 90° with respect to that of said first memory, addressed by said counter and whose output is fed to said probe through a second D-A converter.

Thus, the present invention anticipates injecting into an NMR magnetometer probe an excitation signal free of any energy outside a band of a few Hz about the Larmor frequency. Furthermore, the present invention aims at reinjecting this signal from a very narrow band filter so that the phase shift between the injection signal and the output of the amplifier of the signal of the NMR probe is substantially constant and practically zero for the whole range of frequencies and temperatures. This signal is therefore always centered on the Larmor frequency, except for an error due to the residual phase shifts of the coils, and especially of the amplifier despite its wide passband.

Because a signal is obtained filtered in a very narrow band, it may be used directly by a counting frequency meter.

BRIEF DESCRIPTION OF THE DRAWINGS

These objects, advantages and features of the present invention will be explained in greater detail in the following description of particular embodiments, with reference to the accompanying figures in which.

DESCRIPTION OF THE PREFERRED EMBODIMENTS

Figure 2A:
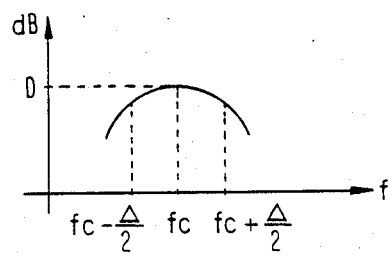
FIGS. 2a and 2b show previously described amplitude and phase characteristics of a NMR probe as a function of its excitation frequency.
Figure 2B:
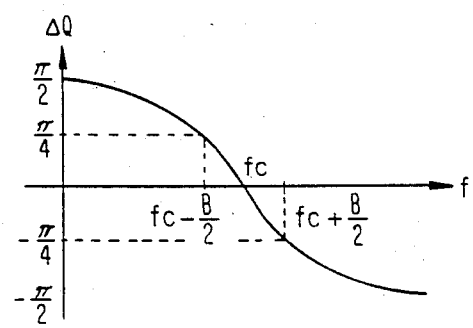

FIGS. 2a and 2b show respectively the amplitude/frequency characteristic and phase/frequency characteristic of an NMR probe considered as a filter. It can be seen from the phase/frequency characteristic of FIG. 2b that the phase $\Delta\rho$ is a substantially linear function of the difference between the excitation frequency f and the resonance frequency fc, for a band of excitation frequencies between $fc-B/2$ and $fc+B/2$ and corresponding to phase values varying between $+\pi/4$ and $-\pi/4$. On the other hand, in this frequency range, FIG. 2a shows that the amplitude D of the resonance signal is substantially constant.

The present invention is based on this observation and proposes, rather than using bandpass filtering of the probe signal, to provide phase locking between the excitation signal and the output signal of the probe.

Figure 3:
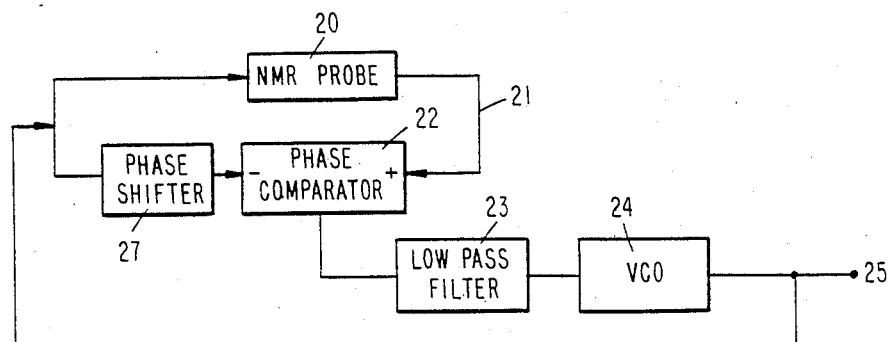
FIG. 3 shows the general diagram of an oscillator of the present invention.

FIG. 3 shows in block form the present invention in its most general aspect. Let us consider an NMR probe 20, if it is suitably excited it outputs the low frequency signal 21 whose pulsation $\omega_o$ (or the frequency $f_0$) it is desired to determine. This signal is fed to the first input of a phase comparator 22 whose output is connected to a very low pass frequency filter 23 and an oscillator whose frequency is controlled by its input voltage (VCO) 24. The output of VCO 24 is fed both to a terminal 25 of a frequency meter not shown for measuring the resonance frequency of the NMR probe and so the magnetic field detected and, by a loop 26, to the low frequency excitation input of the NMR probe and to the negative input of the phase comparator 22 for providing phase locking. A phase shifter 27 providing a given phase shift may be used for offsetting a constant phase shift between the input and the output of the probe, generally 90°.

This method, in its general aspect, namely the use of phase comparison between the excitation signal and the output resonance signal of an NMR probe for setting the frequency of the nuclear oscillator comprising this probe as close as possible to the Larmor frequency, forms one of the important features of the present invention.

In fact, in the present invention, the phase locking loop forms part of the feedback loop of the oscillator formed by the amplifier and the NMR probe.

Figure 1:
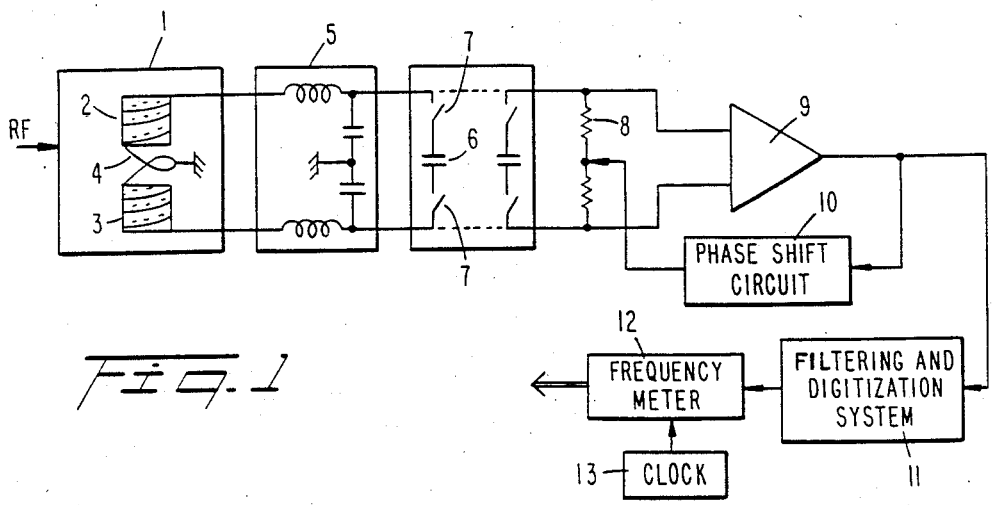
FIG. 1, described above, is a diagram of a nuclear magnetic resonance oscillator of the prior art.

It is here a question of an unusual use of a phase locking loop which is conventionally used when two systems situated at a distance from each other must be strictly controlled, e.g. a television transmitter and a receiver, for finely setting a local clock of the receiver with respect to a clock of the transmitter. But, in this case, it is known to priori what the value of the clock of the transmitter is and it is simply desirable to make a fine adjustment of an oscillator provided at the level of the receiver for adapting it very exactly to the transmitted clock signal. Such use of the phase locking loop would consist, in the case shown in FIG. 1, in using it outside the feedback loop of the oscillator which delivers the signal whose frequency it is desired to measure. With this feedback loop here comprising the elements 1, 5, 6, 8, 9 and 10, the phase locking loop would be used for example in places of circuit 11 and not, as in the present invention, in this feedback loop itself which gives rise to the useful signal.

Here, the problem is then quite different and the transmitted signal which it is desired on the one hand to filter, or in other words to reform by means of the phase locking loop, may vary over a wide range of frequencies, close on two octaves, e.g. from 1000 to 3000 Hz, as was mentioned above.

Figure 4:
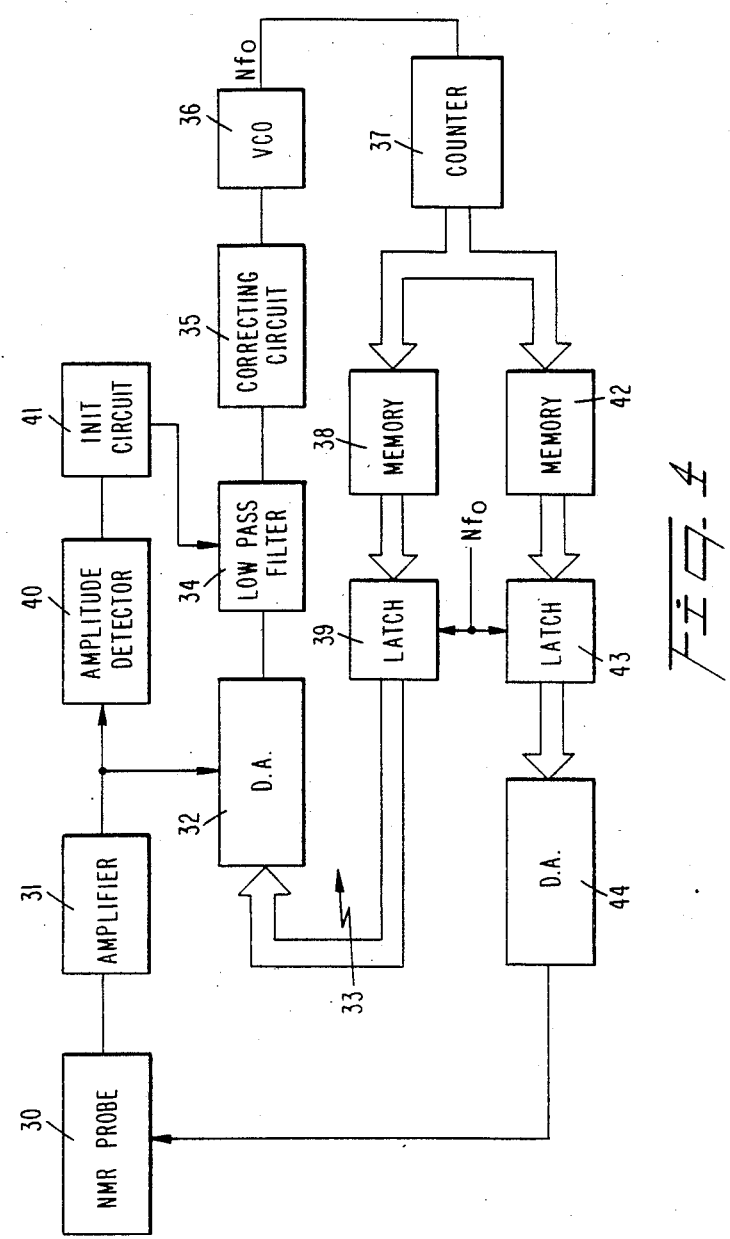
FIG. 4 is a more detailed block diagram of an oscillator of the present invention and its application to a NMR probe.

Furthermore, the present invention provides means for causing a phase locking loop to operate in the particular application considered. These means will be described in greater detail in one embodiment, with reference to FIG. 4. In FIG. 4 an NMR probe 30 is shown, equivalent to probe 20 of FIG. 3, whose output is amplified by a first amplifier 31. The output of amplifier 31 is fed to the reference voltage input or base input of a D-A converter 32. This D-A converter forms the phase comparator of a phase locking loop 33 which comprises essentially a low pass filter 34, e.g. a second order filter, a correcting circuit 35, a VCO 36, a counter 37, a sinusoidal function memory 38 and a latch 39. On the other hand, the output of amplifier 31 is also fed to an amplitude detector 40 followed by an initialization circuit 41. The output of counter 37 is also fed to a second sinusoidal function memory 42 and to a second latch 43 whose output is fed through a D-A converter 44 to the low frequency excitation input of the NMR probe, which corresponds too the re-injected signal 26 of FIG. 3. Similarly, the signal fed to the digital input of the D-A converter 32 corresponds to the signal 26 of FIG. 3 phase shifted by phase shifter 27 of FIG. 3 and fed to the comparison input of the phase comparator 22; in fact, the purpose of the two sinusoidal function memories 38 and 42 is to deliver sinusoidal functions phase shifted by $\pi/2$, e.g. a cosine and a sine.

Assuming the loop locked, i.e. operating at the Larmor frequency $f_0$ of the probe, the operation of this loop is as follows. The VCO oscillator 36 delivers a substantially square wave signal at a frequency $Nf_0$, N being an integer, e.g. between 32 and 4096 ($2^5$ and $2^{12}$). Counter 37 is a counter of capacity N which permanently counts the square waves and thus outputs a digital signal whose value varies from 1 to N (or from 0 to N−1) cyclically. These values 1 to N are delivered as address values to the memory 38 which contains the values of the function $\cos 2\pi i/N$; i.e. at the output of memory 38 we obtain sampling at N values of the function $\cos 2\pi f_0$. This output, synchronized by the latch 39 receiving the signal $Nf_0$ from the VCO, is fed to the D-A converter 32 whose reference voltage input or bias input is the amplified output signal of the probe, i.e. normally, if the loop is effectively locked to the correct frequency, the signal $A \sin(2\pi f_0 t + \phi)$.

Thus we obtain, at the output of the D-A converter 32, an analog signal proportional to the product of the output of the probe, applied to the bias input, multiplied by a signal $\cos 2\pi f_0$ applied in digital form to the digital input. This signal at the output of the D-A converter 32 comprises then an error signal proportional to the phase shift between the signal $2\pi f_0$ and the output signal of the probe on which are superimposed the signals at frequency $2f_0$ and a residual term at the frequency $f_0$. As is known, this signal is filtered by a vary low frequency low pass filter 34 so as to suppress the $f_0$ and $2f_0$ terms and by the correcting circuit 35 at the input of the VCO 36. The correcting circuit 35 is essentially a phase advance network for ensuring the stability of the system with a sufficient gain or phase margin as will be seen further on.

As calculations show, for such a phase locking loop to be locked, the frequencies of the signals at the two inputs of the D-A converter 32 must be extremely close to one another (deviation of a few Hz). Now, on switching on of the system, there is no reason why the output frequency of the VCO should correspond to a frequency which is N times the Larmor frequency. To overcome this problem, the present invention provides a system of initializing the loop. In this system, the amplitude of the output signal of amplifier 31 is detected by an amplitude detector 40 such as a synchronous detector, detecting this amplitude for the frequency $f_0$ corresponding to the instantaneous value (divided by N) of the output frequency of the VCO 36. When this amplitude is less than a predetermined minimum, the amplitude detector 40 acts on an initialization circuit 41 connected to the filtering circuit 34 for delivering a ramp signal to the input of the VCO 36 so as to vary the output frequency of the VCO over the whole range concerned. When the output frequency (divided by N)

of this VCO 36 passes through the resonance frequency of the NMR probe, a signal is detected by detector 40 which inhibits the action of the initialization circuit 41 and the loop is automatically locked.

Figure 5:
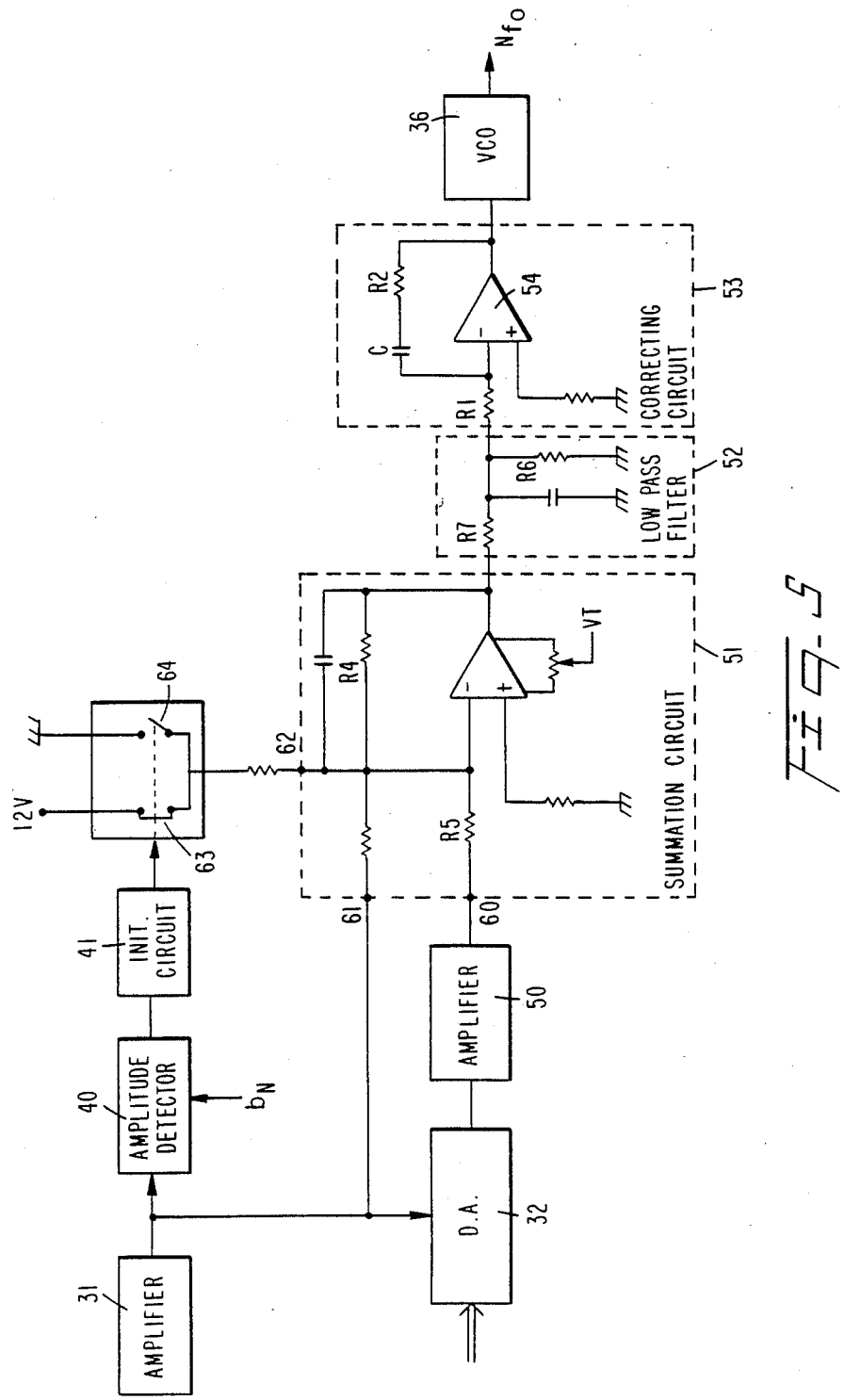
FIG. 5 shows in greater detail a part of the block diagram of FIG. 4 between the phase comparator and the oscillator with voltage controlled frequency.

FIG. 5 shows in greater detail the part including the initialization circuit situated between the output of amplifier 31 and the VCO 36. We find again in this diagram the amplitude detection circuit 40, the initialization circuit 41 and the D-A converter 32. The output of the D-A converter 32 is connected, through an amplifier 50 and a summation circuit 51, to a low pass attenuator filter 52. Circuit 51 and circuit 52 correspond to circuit 34 of FIG. 4. The output of filter 52 is connected to a circuit 53 which provides an integration and phase advance function and which corresponds to the correcting circuit 35 of FIG. 4. This circuit 53 comprises more particularly an operational amplifier 54 which receives the signal to be processed at its inverting input through a resistor R1 and whose output is connected to this inverting input through a capacitor C in series with a resistor R2.

The summation circuit 51 receives a first input the output of amplifier 50 at a terminal 60. It also receives the output reference signal from amplifier 31 at a terminal 61 and the output signal of the initialization circuit at a terminal 62. The input to terminal 61 is used conventionally for suppressing a fraction of the reference voltage. The initialization circuit 41 is connected to terminal 62 through a circuit which may be shown schematically as comprising two switches 63 and 64. Once the loop is locked, switch 64 is closed and switch 63 is opened and the input to terminal 62 has no effect. However, in an initial phase, when it is desired to "lock" the loop, switch 64 is opened and switch 63 is closed as is shown for the figure and a high level signal is applied to terminal 62. This signal, once transmitted to the corrector circuit 53 which has a proportional-integral filter function, applies a voltage ramp to the input of the VCO for searching for the locking zone. When the frequency of the VCO passes through the value $Nf_0$, the synchronous detector 40, which has for first input the output signal from amplifier 31 and as second output the most significant bit $b_N$ of counter 37 which changes state at frequency $f_0$ and whose output is proportional to the amplitude of the signal of the first input, has its output pass from a low constant noise vallue to an appreciable peak value. A threshold detector, which comprises this output with a fixed but adjustable threshold, causes relays 63 and 64 to switch as soon as the level of the threshold is exceeded. The voltage at the input of the VCO is blocked and the loop is locked, no signal being applied to terminal 62 of the summation circuit 51.

On the other hand, in FIG. 5, it will be noted that determining parameters for the stability of the loop and for the determination of the bandwidth of the follower filter equivalent to this loop are the relaxation time T of the NMR probe, the gain $K_p$ of the D-A converter 32 and of its output amplifier 50, and the gain $K_v$ of the VCO 36 associated with its counter 37 corresponding to a divider dividing by N. Time constant parameters must also be taken into account which are defined by the corrector filter, i.e. essentially the constants $\tau_1$ and $\tau_2$:

$$\tau_1 = R1C, \text{ and } \tau_2 = R2C$$

the resistor R2 and the capacitor C being placed in the feedback loop of the amplifier 54 of the integral proportional filter or active filter of the second order 53 and resistor R1 being the input resistor shown in FIG. 5.

The values of $\tau_1$ and $\tau_2$ are chosen as a function of the parameters $K_p$, $K_v$, T, $\omega_n$ and $\xi$, $\omega_n$ and $\xi$ being two parameters well known to a man skilled in the art which determine respectively the bandwidth and the degree of stability of the closed loop system. The expressions of $\tau_1$ and $\rho_2$ are obtained in the following way:

it can be shown that the open loop transfer function of the system described in FIG. 3 in which the corrector network 23 has been disconnected is $$\Delta\phi/\Delta u = K_p K_v \{T/(1+Tp)\}$$

where $\Delta\phi$ is the output of the phase comparator for an excitation $\Delta u$ (in voltage) at the input of the VCO whose frequency variation about its nominal value is $\Delta f = K_v \Delta u$, $K_p$ is the static gain of the phase comparator 22, p is the Laplace operator, well known to a man skilled in the art.

as corrector network, a well known network is chosen of the proportional-integral type for it provides a zero error $\Delta\phi$ under permanent working conditions. so oscillation at the frequency $f=\omega/2\pi$ according to the formula $\omega = \omega_0 + (1/T) \tan \phi$ where $\phi$ is a phase shift outside the phase locking loop (amplifier 31, coils 4). and an unconditional stability of the closed loop system. The formula of this network is $$(1+\tau_2)/\tau_1 p$$

it can be shown that the closed loop function T(p) of the system is obtained from the total open loop function $\zeta(p)$ below $$\zeta(p) = K_p K_v \{T/(1+Tp)\}\{(1+\tau_2 p)/\tau_1 p\}$$

$$T(p) = \zeta(p)/\{1+\zeta(p)\} = (1+\tau_2 p)/\{1+\{(\tau_1/TK)+\tau_2\}p+(\tau_1/K)p^2\}$$

where $K = K_p \cdot K_v$.

Conventionally, for this so-called second order transfer function, the following parameters are defined $\omega_n = (K/\tau_1)^{\frac{1}{2}}$ called natural pulsation of the system is representative of the noise band and of the response speed of the system;

$\xi = (\frac{1}{2})\{(1/\omega_n T) + \tau_2 \omega_n\}$ called damping coefficient which is representative of the degree of stability of the system.

To minimize the response time of the system, very often $\xi \# 0.5$ to 0.707 is taken.

It will be observed that $\omega_n$ does not depend on the NMR probe; on the other hand, the stability of the loop depends on the relaxation time T of the probe.

As a function of the parameters $\omega_n$ and $\xi$, the noise band of the closed loop can be defined as the band of an equivalent rectangular filter having the same variance for identical white noise on both filters and superimposed on the signal. It can be shown that this band may be expressed mathematically as a function of the parameters $\omega_n$ and $\xi$ which are respectively the natural pulsation and the damping of the closed loop system by $$N_{BW} = (\omega_n/2)/(\zeta + \frac{1}{4}\zeta), \text{ in Hz.}$$

By way of example, and to illustrate the originality of the invention, in particular in so far as the corrector network is concerned, $K_p$, $K_v$, $\tau_1$ are chosen so as to have the lowest possible $\omega_n$:

$K_p$: a phase comparator gain of 1/80 may in practice be obtained without degrading the performances of the phase shift caused by the zero shift drifts of amplifiers 50 and 51. For that, a gain of the amplifier is ensured, formed of the D-A converter 32 and of the amplifier 50 of 1 V/rd.

The gain of the amplifier-filter-summator 51 is $1/8 = R_4/R_5$.

The filter attenuator 52 has a static gain of $R_6/(R_6+R_7) = 1/10$ (the resistors $R_4$ to $R_7$ are indicated in FIG. 5).

$K_v$: the VCO 36 is biased in a known way so as to have a gain of 1600 (rd/s)/volt.

$\tau_1 = R_1C$: in practice, $R_1 = 2M\Omega$ and $C = 10$ $\mu$F may be chosen, for the amplifier 53 is chosen so as to have a high input impedance, and a very low leak current, like capacity C.

We obtain: $\omega_n = \{(1600/80)/20\}^{\frac{1}{2}} = 1$ rd/s

If, conventionally, it is desired to obtain damping $\xi = 0.5$, $\tau_2 = R_2C$ is determined as below, knowing that T#2 seconds:

$(1/\omega_n T) + \tau_2 \omega_n = 2\tau = 1$ namely $\tau_2 = 1 - (1/T) = \frac{1}{2}$ whence $R_2 = 1/(2\ 10^{-5}) = 50$ k$\Omega$ Thus, the dependence of the choice of $R_2$ with respect to the relaxation time may be observed in order to obtain the desired damping.

According to another feature of the invention, and returning to FIG. 4, it will be noted that, as VCO for the phase loop, an assembly has been chosen corresponding to VCO 36, delivering a frequency N times higher than the frequency to be detected, followed by a counter and a sinusoidal function memory 38. This choice is in particular dictated by the fact that the output signal of the loop must be re-injected into the NMR probe. It is particularly important for this signal frequency f to be free of harmonics so as to prevent this probe from oscillating at one of its natural frequencies. In fact, in numerous constructions, the probe has a natural frequency at a few kHz, e.g. 14 kHz which, if it were excited, would make detection of the desired frequency situated between 1000 and 3000 Hz impossible. The fact of using successively a 256 position memory 42 for defining a sampled sinusoidal function followed by a latch 43 and a D-A converter 44 makes it possible to deliver to the probe a signal free of harmonics in the band 0-30 kHz which would not be the case if the output of a VCO was directly used adjusted to the desired frequency which is rarely a perfectly sinusoidal signal and which should itself be refiltered by a capacity switching follower filter of known type before being injected into the NMR probe, then given a "square" shape for driving the multiplier of the phase comparator. It is also an advantage at the level of the phase comparator 32 that the input of the loop is as sinusoidal as possible so as to improve the quality of the phase comparison delivered by the D-A converter 32. To satisfy the desired phase relations, memory 38 contains the function cos $(2\pi i/N)$ and the memory 42, the function sin $(2\pi i/N)$.

Of course, the present invention is susceptible of numerous variants as to the construction of each of the circuit blocks and even, in some cases, of their relative arrangement, as will be clear to a man skilled in the art.

For example, as initialization circuit, a structure should be adopted other than the synchronous detector one described above. For transitorily carrying out the amplitude detection function, the output of the D-A converter could be used after equivalent filtering of 34 since it is a question of a substantially sinusoidal multiplier. This amplified and filtered output will be compared with a threshold chosen as a function of the mean noise level. As long as it is less than the threshold, the VCO 36 delivers a continuously variable frequency. As soon as it reaches the threshold, i.e. as soon as the output of the VCO is close to the Larmor frequency, the loop is locked.

What is claimed is:

1. An oscillator, used for measuring an ambient magnetic field and having an oscillation frequency substantially proportional to the intensity of said ambient magnetic field, comprising generation means for generating a low frequency excitation signal, initialization means for sweeping the frequency of an excitation signal over a range of frequencies, a magnetic resonance magnetometric probe for detecting a signal at a frequency of magnetic resonance in response to said excitation signal, and loop means for looking a phase of said excitation signal to a phase of said detected signal, wherein said generation means delivers said low frequency excitation signal in digital form and said loop uses, as a phase comparator, a first D-A converter whose digital input receives said low frequency excitation signal in digital form and whose bias input receives said signal detected by said probe.

2. The oscillator as claimed in claim 1, wherein said generation means comprise:

an oscillator whose frequency is controlled by the output voltage of the phase comparator and which delivers a square wave signal, of a frequency equal to N times the frequency of said low frequency excitation signal, N being a positive integer, a counter of capacity N receiving the output of said controlled frequency oscillator and thus outputting a digital signal whose value varies from 1 to N cyclically, and a first memory, addressed by said counter, containing values of a sinusoidal function of $2\pi i/N$, whose output is said low frequency excitation signal in digital form.

3. The oscillator as claimed in claim 2, wherein N is between 32 and 4096 ($2^5$ and $2^{12}$).

4. The oscillator as claimed in claim 2, wherein said low frequency excitation signal applied to said probe is obtained from a second memory containing values of a sinusoidal function of $2\pi i/N$, shifted by 90° with respect to that of said first memory, addressed by said counter of capacity N and whose output is fed to said probe through a second D-A converter.

5. An oscillator, used for measuring an ambient magnetic field and having an oscillation frequency substantially proportional to the intensity of said ambient magnetic field, comprising sample means exhibiting magnetic resonance at a resonance frequency substantially proportional to the intensity of said ambient magnetic field, generation means for generating an excitation signal, initialization means for sweeping the frequency of said excitation signal over a range of frequencies, excitation means for exciting said sample means in response to said excitation signal, detection means for detecting a signal at said resonance frequency exhibited in said sample means so excited, and loop means for locking a phase of said excitation signal to a phase of said detected signal.

6. In an oscillator having a sample which exhibits magnetic resonance at a resonance frequency substantially proportional to the intensity of an ambient magnetic field, a method for measuring sad ambient magnetic field comprising the steps of:

generating an excitation signal, initializing said excitation signal by sweeping said excitation signal over a range of frequencies, exciting said sample in response to said excitation signal, detecting a signal at said resonance frequency exhibited in said sample when so excited to provide an ambient magnetic field measurement, and locking a phase of said excitation signal to a phase of said detected signal.

* * * * *